United States Patent
Long et al.

(10) Patent No.: US 8,027,574 B2
(45) Date of Patent: Sep. 27, 2011

(54) VAPORIZATION OF THERMALLY SENSITIVE MATERIALS

(75) Inventors: Michael Long, Hilton, NY (US); Bruce E. Koppe, Caledonia, NY (US)

(73) Assignee: Global OLED Technology LLC, Herndon, VA (US)

( * ) Notice: Subject to any disclaimer, the term of this patent is extended or adjusted under 35 U.S.C. 154(b) by 969 days.

(21) Appl. No.: 11/834,039

(22) Filed: Aug. 6, 2007

(65) Prior Publication Data

US 2009/0039175 A1    Feb. 12, 2009

(51) Int. Cl.
*A01G 13/06* (2006.01)
(52) U.S. Cl. .......... 392/386; 392/303; 392/405
(58) Field of Classification Search .......... 392/303
See application file for complete search history.

(56) References Cited

U.S. PATENT DOCUMENTS

| | | | |
|---|---|---|---|
| 2,447,789 A | | 8/1948 | Barr |
| 3,459,924 A | * | 8/1969 | McMichael .......... 219/543 |
| 3,828,161 A | * | 8/1974 | Yamaguchi .......... 392/485 |
| 4,220,846 A | * | 9/1980 | Rice et al. .......... 392/488 |
| 4,310,747 A | * | 1/1982 | Rice et al. .......... 392/466 |
| 4,334,350 A | | 6/1982 | Rice et al. |
| 4,769,292 A | | 9/1988 | Tang et al. |
| 4,885,211 A | | 12/1989 | Tang et al. |
| 5,117,482 A | * | 5/1992 | Hauber .......... 392/492 |
| 5,154,970 A | * | 10/1992 | Kaplan et al. .......... 428/304.4 |
| 5,764,850 A | * | 6/1998 | Olstad et al. .......... 392/485 |
| 5,888,469 A | | 3/1999 | Stiller et al. |
| 5,960,160 A | * | 9/1999 | Clark et al. .......... 392/481 |
| 6,103,149 A | | 8/2000 | Stankiewicz |
| 2005/0279353 A1 | * | 12/2005 | McCoy .......... 128/200.24 |
| 2006/0062918 A1 | | 3/2006 | Long et al. |

FOREIGN PATENT DOCUMENTS

| | | |
|---|---|---|
| EP | 0982411 | 3/2000 |
| WO | 96/41035 | 12/1996 |

\* cited by examiner

*Primary Examiner* — Thor Campbell
(74) *Attorney, Agent, or Firm* — Morgan, Lewis & Bockius LLP

(57) ABSTRACT

A vaporizer for receiving and vaporizing particulate material, comprising: a heater having a reticulated material structure composed of ligands that define voids adapted to receive particulate materials, wherein the voids comprise greater than 85% of the volume of the reticulated material structure so that delivery of particulate material into the voids and conduction of vaporized material from the voids is facilitated; causes heat to be produced or conducted by the ligands to cause the particulate material in the voids to vaporize and be conducted through the voids.

13 Claims, 2 Drawing Sheets

US 8,027,574 B2

VAPORIZATION OF THERMALLY SENSITIVE MATERIALS

FIELD OF THE INVENTION

The present invention relates to the field of physical vapor deposition where a source material is heated to a temperature so as to cause vaporization and create a vapor plume to form a thin film on a surface of a substrate.

BACKGROUND OF THE INVENTION

An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their commonly-assigned U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate dependant vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. The low deposition rate and frequent source recharging place substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the materials are very close. This is generally not the case, and prior art devices frequently require the use of separate sources to co-deposit host and dopant materials. These multiple sources must be maintained in an angled arrangement so that the evaporated materials from each source converge at a common point on an OLED substrate. This use of multiple spaced-apart sources leads to obvious limitations in the number of materials that can be co-deposited and obvious deficiencies in the homogeneity of the host and dopant films.

The organic materials used in OLED devices have a highly non-linear vaporization-rate dependence on source temperature. A small change in source temperature leads to a very large change in vaporization rate. Despite this, many devices employ source temperature as the only means to control vaporization rate. To achieve good temperature control, prior art deposition sources typically utilize heating structures whose solid volume is much larger than the organic charge volume, composed of high thermal-conductivity materials that are well insulated. The high thermal conductivity insures good temperature uniformity through the structure and the large thermal mass helps to maintain the temperature within a critically small range by reducing temperature fluctuations. These measures have the desired effect on steady-state vaporization rate stability but have a detrimental effect at start-up. It is common that these devices must operate for many hours at start-up before steady state thermal equilibrium and hence a steady vaporization rate is achieved.

A further limitation of such sources is that the geometry of the vapor manifold changes as the organic material charge is consumed. This change requires that the heater temperature change to maintain a constant vaporization rate. It is observed that the overall plume shape of the vapor exiting the orifices can change as a function of the organic material thickness and distribution in the source, particularly when the conductance to vapor flow in the source with a full charge of material is low enough to sustain pressure gradients from non-uniform vaporization within the source. In this case, as the material charge is consumed, the conductance increases and the pressure distribution and hence overall plume shape improve.

Some organic materials are extremely thermally sensitive and have relatively low vapor pressures. Difficulty has been encountered when vaporizing these materials, even where the material is metered from a cold reservoir to a heating region on as needed basis. The powder feeding path in prior art devices allows heat to be conducted away from the immediately vaporizing material and thereby hinders vaporization of these sensitive and low vapor pressure materials at commercially practical rates. Heat conduction along the powder feeding path in prior art devices has also been a source of degradation for a few extremely thermally sensitive materials.

SUMMARY OF THE INVENTION

It is therefore an object of the present invention to provide a device and method for vaporizing organic materials while limiting their exposure to temperatures that can cause material degradation. It is a further object of this invention to allow a single source to deposit two or more organic material components. It is a further object of this invention to achieve a steady vaporization rate quickly. It is a further object to maintain a steady vaporization rate with a large charge of organic material and with a steady heater temperature.

This object is achieved by a vaporizer for receiving and vaporizing particulate material, comprising:
  (a) a heater having a reticulated material structure composed of ligands that define voids adapted to receive particulate materials, wherein the voids comprise greater than 85% of the volume of the reticulated material structure so that delivery of particulate material into the voids and conduction of vaporized material from the voids is facilitated; and
  (b) means for causing heat to be produced or conducted by the ligands to cause the particulate material in the voids to vaporize and be conducted through the voids.

It is an advantage of the present invention that only a small portion of organic material is heated, for a short period of time and at a controlled rate. The particles are very rapidly vaporized in a manner wherein they cannot conduct or otherwise dissipate heat to a cooler surface. As a result, the vaporizable material retains its purity and structure until vaporized. The bulk of organic material is maintained at a temperature much cooler than the desired vaporization temperature.

It is a further advantage that the heating apparatus can be held at a lower temperature than with some prior vaporization devices for a given deposition rate, thus reducing the probability of degradation of the vaporizing material.

It is a further advantage of the present invention that it can maintain a steady vaporization rate with a continuously replenished charge of organic material and with a steady heater temperature. The device thus allows extended operation of the source with substantially reduced risk of degrading even very temperature-sensitive organic materials.

It is a further advantage of the present invention that it permits materials having different vaporization rates and degradation temperature thresholds to be co-sublimated in the same source.

It is a further advantage of the present invention that it permits linear vaporization rate control by controlling the volumetric metering rate of the organic material powder.

It is a further advantage of the present invention that it can rapidly stop and reinitiate vaporization and achieve a steady vaporization rate quickly by controlling the metering rate of the organic material, reducing contamination of the deposition chamber walls and conserving the organic materials when a substrate is not coated.

DETAILED DESCRIPTION OF THE INVENTION

Figure 1A:
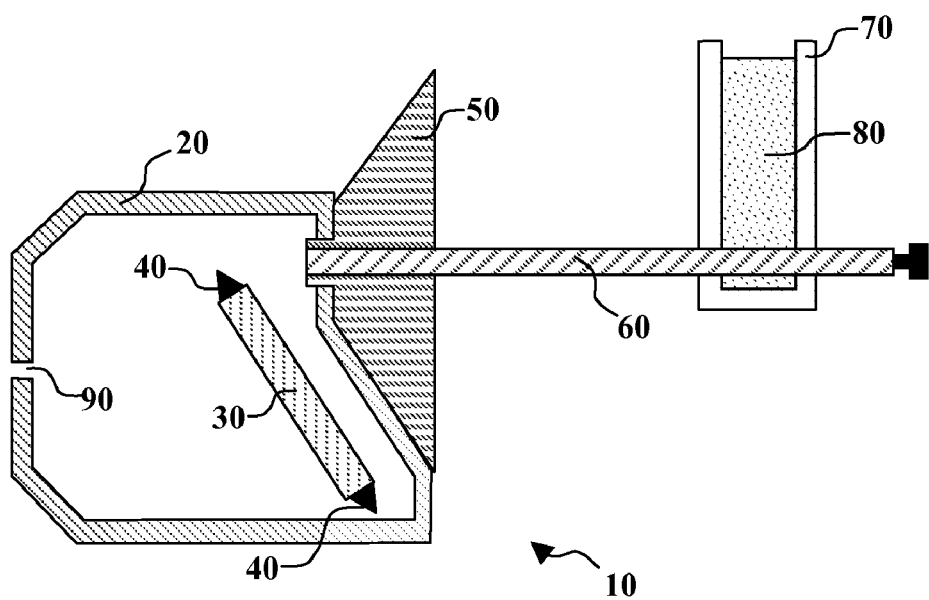
FIG. 1a shows a cross-sectional view of one embodiment of a vaporizing system according to the present invention.

Turning now to FIG. 1, there is shown a cross-sectional view of one embodiment of a vaporizing system according to the present invention. Vaporizing system 10 includes a manifold 20 which has a heater 30, which can be held in place by supports 40. Heater 30 receives and vaporizes particulate material 80. Heater 30 has a reticulated material structure, composed of ligands that define voids in the material. The voids comprise greater than 85% of the volume of the reticulated material structure to facilitate delivery of particulate material into the voids, and conduction of vaporized material from the voids to the surrounding environment. One useful reticulated material for heater 30 is reticulated vitreous carbon. Reticulated vitreous carbon is an open-pore foam material composed of glass-like carbon ligands that define voids that can receive particulate materials. Reticulated vitreous carbon can have a void volume as great as 97%. Such material has been described, e.g. U.S. Pat. No. 5,888,469 by Stiller et al., and U.S. Pat. No. 6,103,149 by Stankiewicz, and is commercially available from several sources, such as ERG Materials and Aerospace Corporation of Oakland, Calif., and Ultramet of Pacoima, Calif. It is available uncoated, or with a conformal coating of a refractory metal or ceramic on the ligands. These coatings are useful to improve the thermal conductivity of the vitreous carbon ligands. Some examples of useful refractory metals include tungsten, rhenium, tantalum, niobium, and molybdenum. Some examples of useful ceramic coating are silicon carbide, hafnium carbide, tantalum carbide, niobium carbide, and zirconium carbide. In the case of a ceramic coating, a conductive ceramic can be useful for some of the embodiments described herein wherein a current is used to heat heater 30. Metallic carbides are thus useful in this regard. Silicon carbide is not highly electrically conductive, but a silicon carbide coating on a vitreous carbon framework forms a heating structure having both good thermal and electrical conductivity.

Figure 1B:
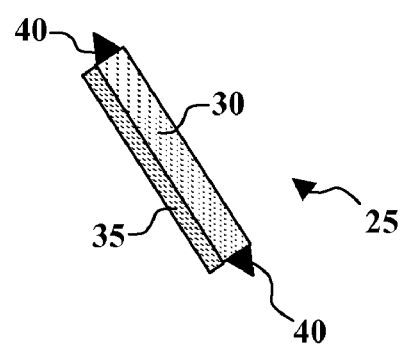
FIG. 1b shows an alternate embodiment of a vaporizer according to the present invention.
Figure 2A:
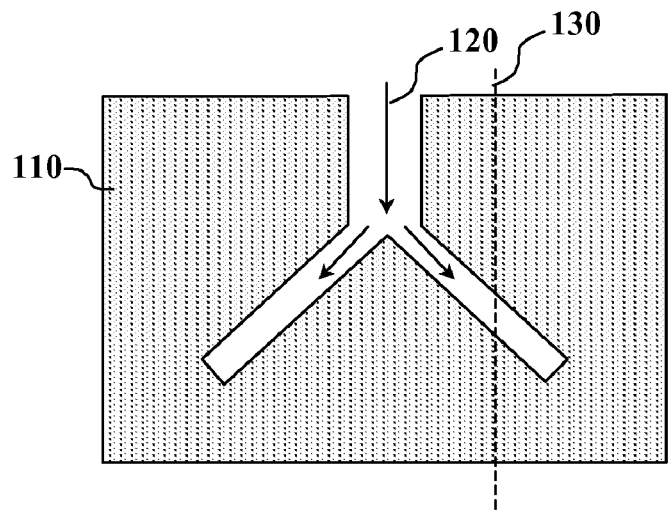
FIG. 2a shows a cross-sectional view of another embodiment of a vaporizer according to the present invention.
Figure 2B:
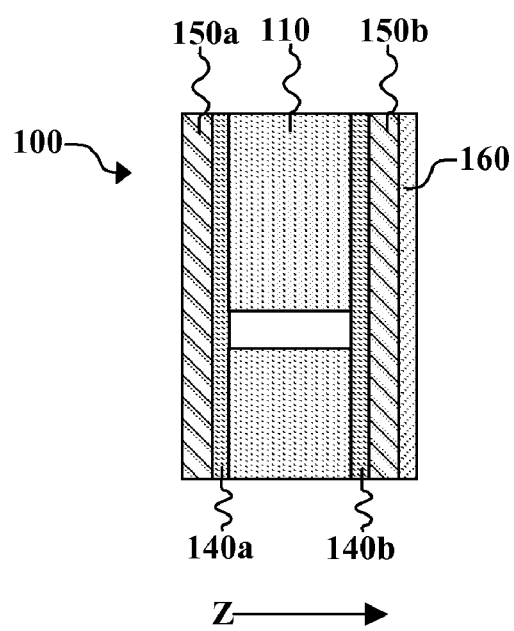
FIG. 2b shows a different cross-sectional view of the vaporizer of FIG. 2a with current-carrying elements for heating.

A container 70 can hold and serve as a source for particulate material 80. Particulate material 80 can be delivered from container 70 to heater 30 by means of feeding apparatus 60 such that the particulate materials 80 will be disposed in the voids of heater 30. Some examples of a feeding apparatus that can be used with this invention have been described by Long et al. in commonly assigned U.S. Patent Application Publication No. 2006-0062918. Particulate material 80 is delivered to the end of feeding apparatus 60, and is received by heater 30. Thus, a steady vaporization rate can be achieved by controlling the rate of delivery of particulate material 80. The delivery can be stopped and started to rapidly stop and reinitiate vaporization. Heater 30 is heated to a temperature necessary to vaporize particulate material 80. Because the particulate material is in an environment surrounded by heated ligands, it can be rapidly vaporized and thus require a lower temperature for rapid and complete vaporization than other vaporization methods. Because the vaporization of materials is rapid, a mixture of materials can be vaporized as efficiently as a single material by this method. Heating can be accomplished by a variety of methods known in the art, either by causing heat to be produced by the ligands of heater 30, or by producing heat externally and causing the heat to be conducted through heater 30 by its ligands. If the reticulated material structure is electrically conductive, current can flow through the ligands, e.g. supports 40 can incorporate electrical contacts, to cause heat to be produced by the current flow. In the configuration of FIG. 1a, the desirable degree of electrical conductivity can be provided by a reticulated vitreous carbon matrix with a coating that provides improved thermal conductivity, e.g. silicon carbide as described above. Alternatively, in another embodiment, heat can be provided by a separate heating element (not shown), e.g. a tungsten wire, that is in contact with heater 30. In another embodiment, heater 30 can be supported by a thermal transfer support 35, e.g. a metal plate attached to the bottom of heater 30 as shown in FIG. 1b. Heat can be transferred into thermal transfer support 35, e.g. from a separate heating element, so that the support enables rapid heating of heater 30 by conduction through the ligands of the heater. Heater 30 with its heat source is herein called a vaporizer, e.g. vaporizer 25. The particulate material 80, upon entering the voids of the reticulated material structure, will vaporize from the heat of the structure surrounding it. The particulate material 80 can be such that it sublimes, that is it changes from a solid directly to a vapor state, or passes through a liquid state before vaporizing. The reticulated structure facilitates conduction of the vaporized particulate material 80 from the voids of the reticulated structure.

For efficient vaporization in heater 30, it is desirable that particulate material 80 have a effective diameter of 200 μm or less. The voids in the reticulated material structure must have an effective diameter equal to or greater than the effective diameter of the particulate material so that delivery of the particulate material 80 into the voids is facilitated. Desirably, the effective diameter of the voids is greater than two times the effective diameter of the particulate material 80, and usefully greater than 3.5 times the effective diameter of the particulate material 80. This, coupled with a sufficient temperature to vaporize the particulate material 80, can yield an average residence time of the particulate material 80 in the reticulated material structure of less than 2 seconds.

Heater 30 can be flat or at an angle. Placing heater 30 at an angle can have some advantages that facilitate delivery of the particulate material 80 into the voids and conduction of vaporized material from the voids. First, particulate material 80 that falls onto heater 30 is less likely to clump in one spot, thus increasing the likelihood that the particulate material 80 will be delivered into the voids of heater 30. Second, the particulate material 80, which falls under gravity, will encounter a longer path through heater 30, thus reducing the possibility that particulate material 80 will exit heater 30 before being vaporized. Usefully, the angle of heater 30 relative to horizontal is between 30° and 70°. Heater 30 is typically between 0.5 and 5 cm thick. To further facilitate delivery of the particulate material 80 into the voids of the heater, heater 30 can be vibrated. The reticulated carbon structure has a high rigidity and transmits vibration with very little loss, so barely perceptible levels of vibration are very effective in causing powder to penetrate into the pores of the heater.

The ratio of pore size to effective particle diameter, the angle and thickness of heater 30, the presence or absence of vibration of heater 30, and the temperature of heater 30 can all affect the rate of vaporization of a given particulate material 80. Thus, the exact properties and orientation of heater 30 for optimum vaporization of a particulate material 80 will depend on the properties of the particulate material.

To further limit the time at which particulate material 80 is at an elevated temperature, it can be useful to cool the particulate material 80 before it reaches heater 30. For example, base 50 can be a metal structure that has external cooling (not shown). Particulate material 80 is cooled as it passes through the base via feeding apparatus 60, thus reducing the effect of heat transfer from heater 30 to the walls of manifold 20 and to the end of feeding apparatus 60 and maintaining the bulk of the particulate material 80 at a temperature much cooler than the vaporization temperature.

Manifold 20 is so positioned to readily receive vaporized material produced by heater 30. The heat produced in or conducted by heater 30 causes the particulate material 80 in the voids to vaporize, and the reticulated material structure of heater 30 causes the vaporized material to be conducted through the voids and to be delivered to manifold 20. The vaporized material can then pass through aperture 90 and coat the material onto a desired substrate. The position of manifold 20 in FIG. 1*a* allows for coating a vertically-oriented substrate. It will be understood that variations are possible in the positioning of an aperture 90 and the position and orientation of the substrate to be coated.

Turning now to FIG. 2*a* and FIG. 2*b*, there is shown another embodiment of a vaporizer for receiving and vaporizing particulate material according to this invention. FIG. 2*a* shows a cross-sectional view of a heater, which is a part of the vaporizer, having a reticulated material structure as described above. In this embodiment, heater 110 is designed to operate in the orientation shown. Particulate material 80 falls through particulate path 120, in which a portion of the path is angled. The particulate material 80 can thus be delivered into the voids of heater 110, as described above, in the lower portion of particulate path 120, where it can be vaporized by the heat produced or conducted by the ligands.

FIG. 2*b*, which is perpendicular to the view of FIG. 2*a* at cross-section line 130, shows a cross-sectional view of vaporizer 100 that includes heater 110. Heater 110 is sandwiched between conductive plates 150*a* and 150*b*. The conductive plates 150*a* and 150*b* are of a conducting metal that can act as electrodes for current that flows through the ligands of heater 110 to cause heat to be produced. A variety of metals can be used for the conducive plates 150*a* and 150*b*. Conveniently, titanium can be used due to its relative chemical inertness and its ability to retain its strength at elevated temperature. Compliant material 140*a* and 140*b* is an electrically and thermally conductive material that can conform to the surface texture of heater 110 and of conductive plates 150*a* and 150*b*, thus providing a better electrical contact between the heater 110 and the conductive plates 150*a* and 150*b*. One example of useful compliant material is GRAFOIL®. UCAR Carbon Company Inc. of Wilmington, Del., manufactures GRAFOIL® Flexible Graphite as a rolled sheet product that exhibits excellent tensile strength and typically exceeds 97% elemental carbon by weight.

Also included is heat sink 160. The heat sink 160 allows rapid modulation of the temperature of the reticulated heater to enable some fine temporal control of the deposition rate beyond the control afforded by the metering rate of the powder. Conductive plate 150*b* acts as a thermal resistor so that the temperature of the reticulated heater can be controlled by the balance between the heat generated in the ligands by electrical resistance and the heat flow to the heat sink 160. In practice, the heat sink 160 can be formed so as to contact a larger structure in vaporizing system 10, such as a water-cooled base.

One advantage of this embodiment is that the distance between the electrical contacts is less than in FIG. 1. This allows the use of uncoated reticulated vitreous carbon as an electrically conductive reticulated material structure, since its thermal conductivity at this distance is appropriate for conducting heat to heat sink 160. Uncoated reticulated vitreous carbon is easier to manufacture and is significantly less expensive. The thickness of heater 110 cannot be too great, as that would compromise the ability to rapidly cool heater 110, nor can it be too small, as the vaporized material must be conducted through the voids of heater 110 and escape through the walls at the edges of the heater 110, between conductive plates 150*a* and 150*b*. Heater 110 is between 0.5 cm and 5 cm in the Z direction. Another advantage of this configuration is that, even if a particle does not enter the voids of heater 110, it will still be in a heated chamber (the interior of particulate path 120) and will thus vaporize. A further advantage of this embodiment is that, because the thickness of heater 110 is not great, one can rapidly change the temperature of the heater by adjusting current flowing between conductive plates 150*a* and 150*b*. This temperature adjustment can be a secondary control for vaporization rate.

The invention has been described in detail with particular reference to certain preferred embodiments thereof, but it will be understood that variations and modifications can be effected within the spirit and scope of the invention.

PARTS LIST

10 vaporizing system
20 manifold
25 vaporizer
30 heater
35 thermal transfer support
40 support
50 base
60 feeding apparatus
70 container
80 particulate material
90 aperture
100 vaporizer
110 heater
120 particulate path
130 cross-section line 140a compliant material
140b compliant material
150a conductive plate
150b conductive plate
160 heat sink

The invention claimed is:

1. A vaporizing system for vaporizing particulate material, comprising:
   (a) a source of particulate material;
   (b) a heater having a reticulated material structure composed of ligands that define voids adapted to receive particulate materials, wherein the voids comprise greater than 85% of the volume of the reticulated material structure so that delivery of particulate material into the voids and conduction of vaporized material from the voids is facilitated;
   (c) a manifold positioned to receive vaporized material produced by the heater;
   (d) means for delivering the particulate material to the heater by gravity for causing such material to be disposed in the voids; and
   (e) means for causing heat to be produced or conducted by the ligands to cause the particulate material in the voids to vaporize and be delivered to the manifold;
   wherein the heater is set at an angle of 30 to 70 degrees relative to horizontal.

2. The vaporizing system of claim 1 wherein the reticulated material structure is electrically conductive and the heat-causing means causes current to flow through the ligands to cause heat to be produced.

3. The vaporizing system of claim 2 wherein the reticulated material structure includes vitreous carbon.

4. The vaporizing system of claim 2 wherein the reticulated material structure includes vitreous carbon and a conformal coating of a refractory metal or conductive ceramic on the ligands.

5. The vaporizing system of claim 4 wherein the refractory metal includes tungsten, tantalum, or molybdenum.

6. The vaporizing system of claim 4 wherein the conductive ceramic includes silicon carbide.

7. The vaporizing system of claim 1 wherein each void has an effective diameter equal to or greater than the effective diameter of the particulate material.

8. The vaporizing system of claim 7 wherein each void has an effective diameter greater than two times the effective diameter of the particulate material.

9. The vaporizing system of claim 1 wherein the average residence time of the particulate material in the reticulated material structure is less than 2 seconds.

10. The vaporizing system of claim 1 wherein the particulate material is selected to change from a solid to a vapor state, or through a liquid state before vaporizing.

11. The vaporizing system of claim 1 wherein the reticulated material structure is vibrated.

12. The vaporizing system of claim 1 wherein the heat-causing means is a separate heating element.

13. The vaporizing system of claim 1 further including means to cool the particulate material before it reaches the reticulated material structure.

* * * * *